US009001582B2

(12) United States Patent
Fujimura et al.

(10) Patent No.: US 9,001,582 B2
(45) Date of Patent: Apr. 7, 2015

(54) NONVOLATILE SEMICONDUCTOR MEMORY DEVICE HAVING A COLUMN DECODER WITH MULTIPLE DATA BUS PORTIONS CONNECTED VIA A SWITCH

(71) Applicant: Kabushiki Kaisha Toshiba, Tokyo (JP)

(72) Inventors: Tomofumi Fujimura, Kanagawa (JP); Naofumi Abiko, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 74 days.

(21) Appl. No.: 13/784,658

(22) Filed: Mar. 4, 2013

(65) Prior Publication Data

US 2013/0250684 A1 Sep. 26, 2013

(30) Foreign Application Priority Data

Mar. 22, 2012 (JP) ................................. 2012-065148

(51) Int. Cl.
*G11C 16/04* (2006.01)
*G11C 16/06* (2006.01)
*G11C 16/24* (2006.01)
*G11C 16/26* (2006.01)
*G11C 11/56* (2006.01)

(52) U.S. Cl.
CPC ............ *G11C 16/06* (2013.01); *G11C 16/0483* (2013.01); *G11C 16/24* (2013.01); *G11C 16/26* (2013.01); *G11C 11/5642* (2013.01)

(58) Field of Classification Search
USPC ............ 365/185.06, 230.03, 205, 63, 185.22
See application file for complete search history.

(56) References Cited

U.S. PATENT DOCUMENTS

| 5,648,928 | A  | * | 7/1997 | Yoon et al. ..................... 365/63 |
| 5,825,709 | A  | * | 10/1998 | Kobayashi ............... 365/230.03 |
| 6,134,169 | A  | * | 10/2000 | Tanaka ......................... 365/222 |
| 6,169,684 | B1 | * | 1/2001 | Takahashi et al. ......... 365/49.12 |
| 6,219,269 | B1 |   | 4/2001 | Fujita |
| 6,529,418 | B2 | * | 3/2003 | Nakai et al. ............. 365/189.04 |
| 6,721,198 | B2 | * | 4/2004 | Kang ............................. 365/145 |
| 7,796,439 | B2 | * | 9/2010 | Arai et al. ............... 365/185.22 |
| 8,374,041 | B2 |   | 2/2013 | Komai |
| 2002/0031039 | A1 |   | 3/2002 | Suzuki |

FOREIGN PATENT DOCUMENTS

JP 09-190694 7/1997
JP 2009-019680 1/2009

* cited by examiner

*Primary Examiner* — Connie Yoha
(74) *Attorney, Agent, or Firm* — Patterson & Sheridan, LLP

(57) ABSTRACT

A nonvolatile semiconductor memory device includes memory cells arranged into memory strings with word lines each connected to a different memory cell of the memory strings. The device also includes bit lines each connected to a different memory string and a column decoder connected to the bit lines. The column decoder includes sense amplifiers, data latches, and a data bus connecting sense amplifiers and data latches. The data bus is divided into at least two portions and includes a first portion connected to a second portion by a switch.

16 Claims, 8 Drawing Sheets

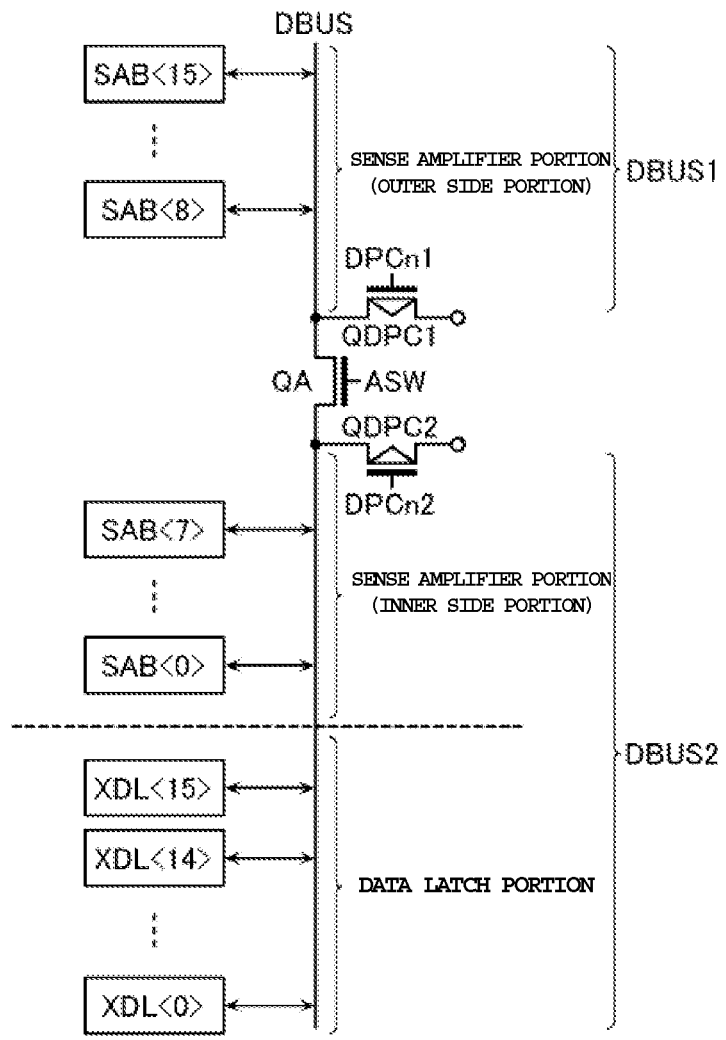
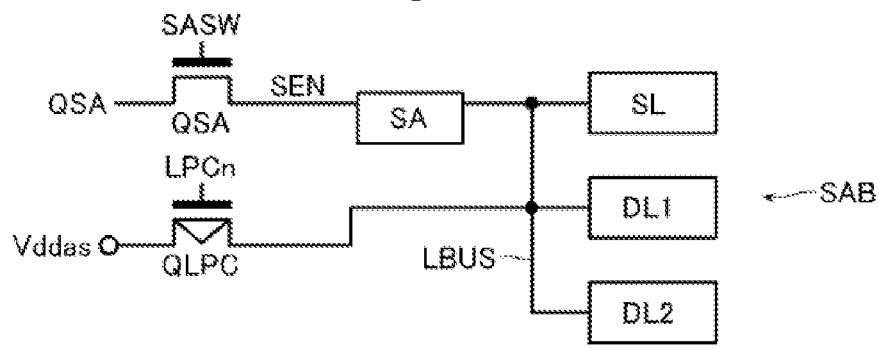

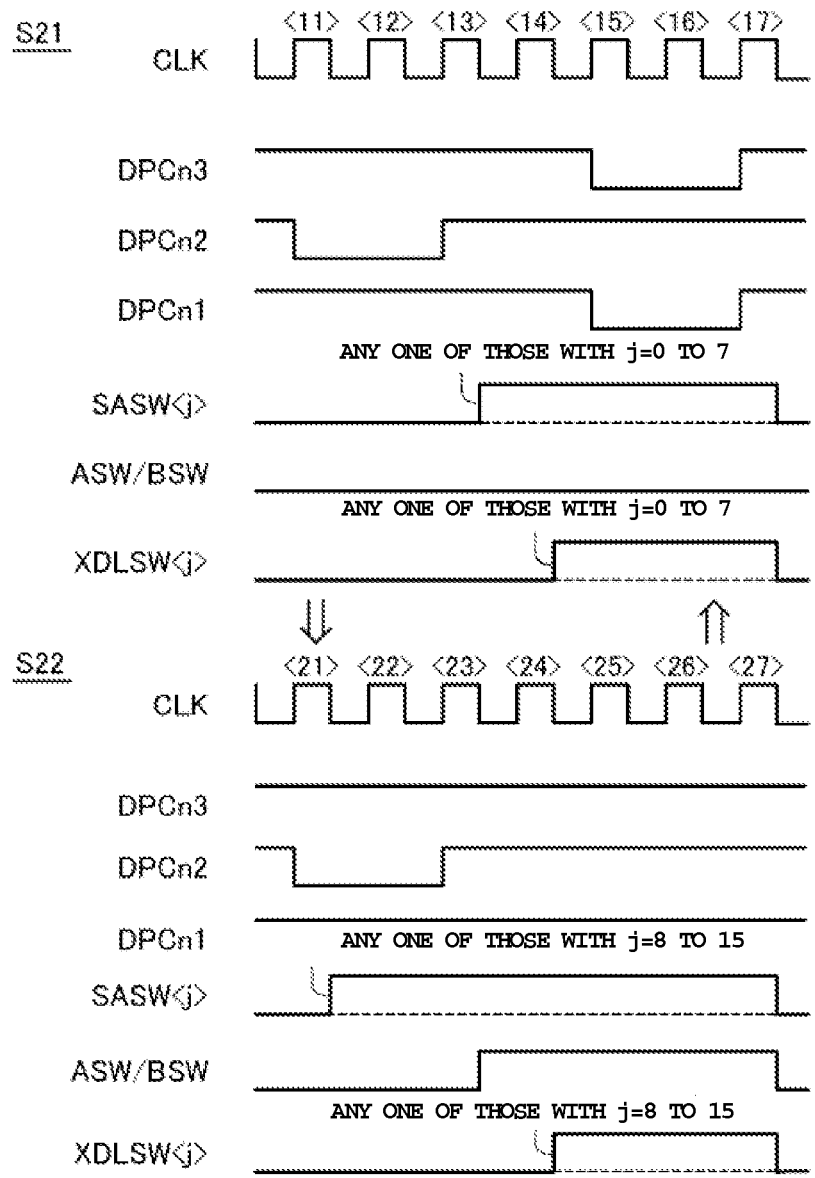

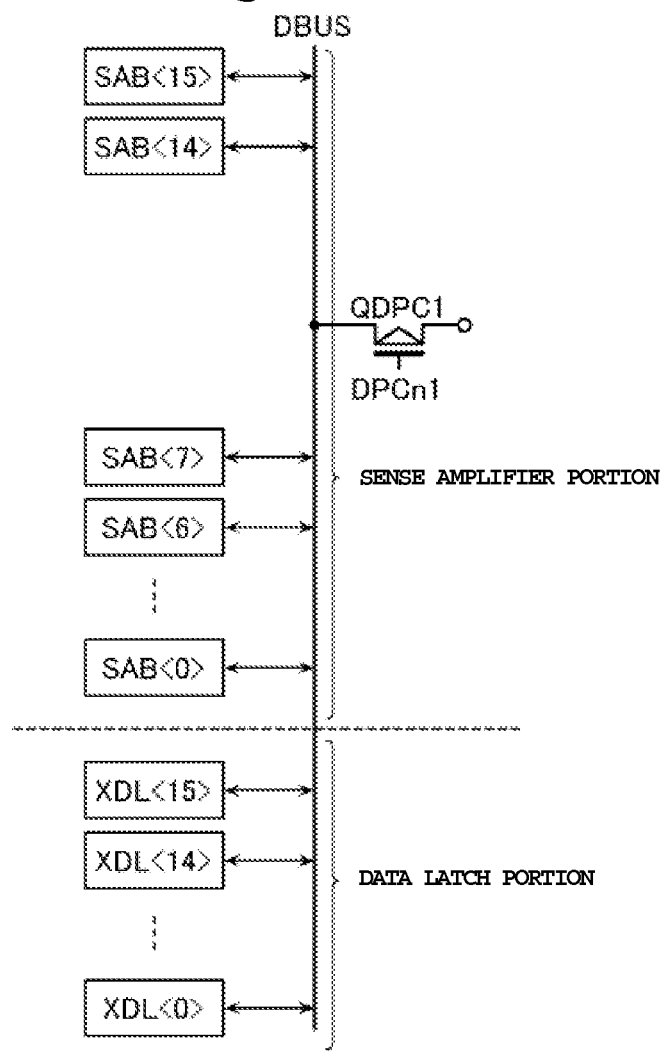

NONVOLATILE SEMICONDUCTOR MEMORY DEVICE HAVING A COLUMN DECODER WITH MULTIPLE DATA BUS PORTIONS CONNECTED VIA A SWITCH

CROSS-REFERENCE TO RELATED APPLICATION

This application is based upon and claims the benefit of priority from Japanese Patent Application No. 2012-065148, filed Mar. 22, 2012; the entire contents of which are incorporated herein by reference.

FIELD

Embodiments described herein relate to a nonvolatile semiconductor memory device.

BACKGROUND

The memory cell array of NAND-type flash memory has multiple memory cells connected in series to form NAND cell units. Each NAND cell unit has select gate transistors arranged on each end, respectively. Through these select gate transistors, connection is made to bit lines and source lines that are connected to the NAND cell units. In addition, control gates of each memory cell in the NAND cell unit are connected to different respective word lines.

For NAND-type flash memory, multiple memory cells are connected in series with a shared source and drain. The select gate transistors and the bit line and source line contacts can be shared by multiple memory cells, so that it is possible to reduce the size of the memory cells. In addition, for NAND-type flash memory, the shapes of the element regions of the word lines and memory cells are formed in a stripe shape pattern, and so it is possible to miniaturize the overall chip dimensions and realize high storage capacity (density).

With the recent progress in miniaturization of the memory cells, the number of the memory cells contained in the memory cell array has been on the rise, and, related to this trend, the circuit area of the peripheral circuit has also increased as more connecting lines are required. The increase in the circuit area of the peripheral circuit leads to an increase in the length of the data bus adopted for data transceiving between the elements of the sense amplifiers, data latches, and other peripheral circuits. Because it takes time to carry out charging/discharging through the data bus, the process for data read or data write becomes slower as a result. Also, the peak current required for charging/discharging with respect to the data bus increases, which is undesirable.

DESCRIPTION OF THE DRAWINGS

FIG. 2 is a diagram illustrating a column decoder of the nonvolatile semiconductor memory device according to the first embodiment.

FIG. 3 is a diagram illustrating sense amplifier blocks of the column decoder in the nonvolatile semiconductor memory device according to the first embodiment.

FIG. 8 is a diagram illustrating the waveform of the control signal in the arithmetic and logic operation process in the column decoder of the nonvolatile semiconductor memory device according to the second embodiment.

FIG. 9 is a diagram illustrating a column decoder of a nonvolatile semiconductor memory device according to a comparative example.

DETAILED DESCRIPTION

The present disclosure describes a nonvolatile semiconductor memory device that can decrease the load of the shared data bus in a peripheral circuit. In general, according to one embodiment, the nonvolatile semiconductor memory devices according to embodiments of the present disclosure will be explained with reference to the drawings.

The nonvolatile semiconductor memory device according to this embodiment includes memory cells arranged into memory strings with word lines each connected to a different memory cell of the memory strings. The device includes bit lines each connected to a different memory string and a column decoder connected to the bit lines. The column decoder includes multiple sense amplifiers and data latches. The column decoder includes a data bus connecting the sense amplifiers and data latches. The data bus of the column decoder is divided into at least two portions and includes a first portion connected to a second portion by a switch.

The a memory cell array can include multiple first wirings, multiple second wirings, and multiple memory cells that store in a nonvolatile state the data selected by the first wiring and the second wiring; a column decoder having the following parts for each column including a group of a prescribed number of the second wirings: multiple sense amplifier blocks that hold the data read and written in the memory cells via the second wirings, multiple external data latches that hold the data output to the outside, and a data bus for sending and receiving the data among the multiple sense amplifier blocks and the multiple external data latches; and a controller that controls the column decoder. The data bus has a sense amplifier portion where the multiple sense amplifier blocks are connected, and a data latch portion where the multiple external data latches are connected. The sense amplifier portion of the data bus further has an inner side portion that is adjacent to the data latch portion of the corresponding data bus and is connected to a prescribed number of the sense amplifier blocks, an outer side portion that is farther from the data latch portion than the inner side portion and is connected to a prescribed number of the sense amplifier blocks, and a switch that electrically connects/disconnects the inner side portion and the outer side portion.

(First Embodiment)

In the following, the overall constitution of the nonvolatile semiconductor memory device according to the first embodiment will be explained.

Figure 1:
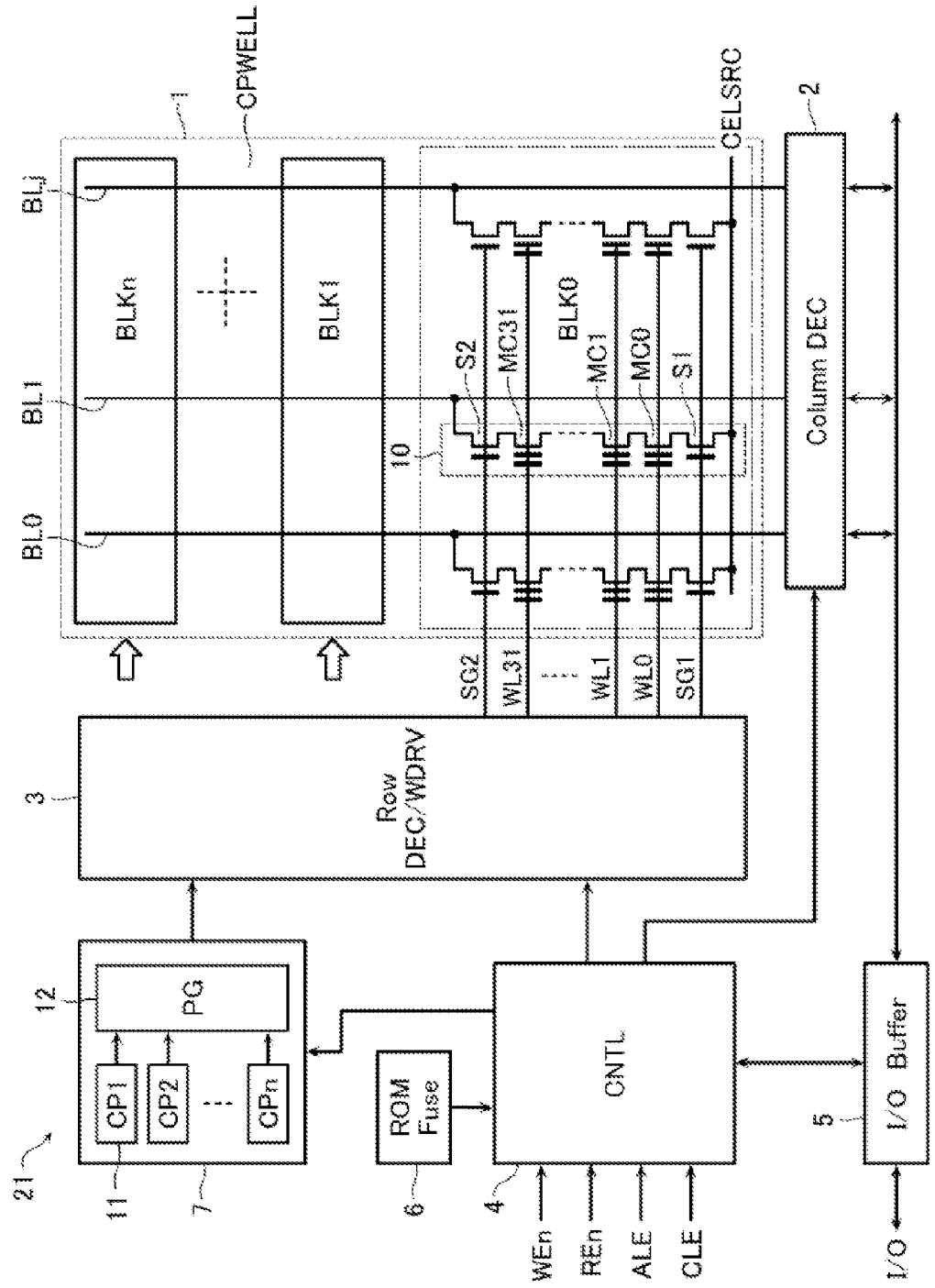
FIG. 1 is a block diagram illustrating a nonvolatile semiconductor memory device according to a first embodiment.

FIG. 1 is a block diagram illustrating the NAND-type flash memory 21 (nonvolatile semiconductor memory device) according to this embodiment. As shown in FIG. 1, this NAND-type flash memory 21 includes a memory cell array 1, a column decoder 2, a row decoder 3, a controller 4, an input/output buffer 5, a ROM fuse 6, and a voltage generator 7. Here, the controller 4 forms the control part for the memory cell array 1.

The memory cell array 1 has a constitution of a matrix configuration of the NAND cell units 10. Each of the NAND cell units 10 includes multiple memory cells MC (MC0, MC1, . . . MC31) connected in series, and select gate transistors S1, S2 connected to its two ends, respectively.

Although not shown in the drawing, it is well known that each of the memory cells MC has a floating gate electrode as the charge accumulating layer on the gate insulating film (tunnel insulating film) formed between the drain and the source, and it has a control gate electrode formed via an inter-gate insulating film on the floating gate electrode. The control gate is connected to one of the word lines.

The source of the select gate transistor S1 is connected to the common source line CELSRC, and the drain of the select gate transistor S2 is connected to the bit line BL.

The control gates of the memory cells MC in the NAND cell units 10 are connected to different word lines WL (WL0, WL1, . . . WL31), respectively. The gates of the select gate transistors S1, S2 are connected to the select gate lines SG1, SG2 parallel with the word lines WL, respectively. The collection of the multiple memory cells that share one word line WL forms 1 page or 2 pages. The collection of the NAND cell units 10 that share the word line WL and the select gate lines SG1, SG2 forms a block BLK as the unit for data deletion.

As shown in FIG. 1, in the memory cell array 1, multiple blocks BLK (BLK0, BLK1, . . . BLKn) are formed in the direction of the bit line BL. The memory cell array 1 containing the multiple blocks is formed in one cell well (CPWELL) on a silicon substrate.

The column decoder 2 is connected to the bit line BL of the memory cell array 1. The column decoder 2 has multiple sense amplifier blocks that detect and hold the data read from the memory cells MC, and multiple data latches that hold the data input from the outside via the input/output buffer or the data output to the outside via the input/output buffer. The row decoder 3 (containing a word line driver) selects the word line WL and the select gate lines SG1, SG2 for driving.

The input/output buffer 5 carries out data transceiving between the column decoder 2 and the external input/output terminal. In addition, it also works to receive the command data and the address data. The controller 4 receives the external control signals, such as the write enable signal WEn, the read enable signal REn, the address latch enable signal ALE, the command latch enable signal CLE, and the like, and carries out the overall control of the memory operation.

More specifically, the controller 4 contains a command interface and an address hold/transfer circuit, and it determines whether the supplied data are the write data or the address data. Corresponding to the determination result, the write data are transferred to the column decoder 2, and the address data are transferred to the column decoder 2 and the row decoder 3.

In addition, the controller 4 carries out control on the sequence of read, write/deletion and control of the applied voltage, and the like based on the external control signals.

The voltage generator 7 has multiple booster circuits 11 and a pulse generator 12. The booster circuits 11 may be made of the well known charge pump circuits (charge pump circuits CP1, CP2, . . . CPn), respectively. The voltage generator 7 works as follows: on the basis of the control signal from the controller 4, it switches the number of the booster circuits 11 that are turned on, and it further controls the pulse generator 12 to generate the desired pulse voltage.

(Column Decoder)

In the following, the column decoder 2 will be explained in more detail.

First of all, the constitution of the column decoder 2 in this embodiment will be explained.

FIG. 2 is a diagram illustrating the constitution of the column decoder 2 in this embodiment. FIG. 3 is a diagram illustrating the constitution of the sense amplifier block SAB of the column decoder 2 in this embodiment.

In the memory cell array 1, one column includes the memory cells MC along J (for example, J=16) bit lines BL. In the column decoder 2, for each column, the sense amplifier blocks SAB and the external data latches XDL (hereinafter simply to be referred to as "data latches XDL") in a number corresponding to the number J of the bit lines BL are arranged. When the read system wherein the multiple bit lines BL of 1 column are simultaneously taken as the read object (hereinafter to be referred to as ABL system) is adopted, corresponding to the number J of the bit lines BL, J sense amplifier blocks SAB and [J] data latches XDL are arranged. In the following, explanation will be made in the case when the ABL system is adopted. However, the present embodiment is not limited to the ABL system. For example, according to the present embodiment, one may also adopt the odd number/even number system wherein the odd-numbered bit lines and the even-numbered bit lines are alternately read.

As shown in FIG. 2, for each column, the column decoder 2 has 16 sense amplifier blocks SAB <0> to <15>, 16 data latches XDL <0> to <15>, as well as a data bus DBUS that transfers data between the sense amplifier blocks SAB and the data latches XDL.

The data bus DBUS can be divided in to a sense amplifier portion where the sense amplifier blocks SAB are connected and a data latch portion where the data latches XDL are connected. In addition, the sense amplifier portion of the data bus DBUS can be divided to an inner side portion adjacent to the data latch portion and having the sense amplifier blocks SAB <0> to <7> connected to it and an outer side portion farther from the data latch portion than the inner side portion and having the sense amplifier blocks SAB <8> to <15> connected to it. The inner side portion and outer side portion of the sense amplifier portion are connected with each other via an n-type transistor QA (the first switch) under control of the control signal ASW. In other words, with the transistor QA as a boundary, the data bus DBUS has the outside portion of the sense amplifier portion and the portion including the inner side portion of the sense amplifier portion and the data latch portion formed such that they can be electrically connected/disconnected from each other. In the following, for the data bus DBUS, the portion made of the inner side portion of the sense amplifier portion will be referred to as the first partial data bus DBUS1, and the portion including the outside portion of the sense amplifier portion and the data latch portion will be referred to as the second partial data bus DBUS2. In addition, the collection including the sense amplifier blocks SAB <0> to <7> connected to the second partial data bus DBUS2 will be referred to as the inner side sense amplifier block group, and the collection of the sense amplifier blocks SAB <8> to <15> connected to the first partial data bus DBUS1 will be referred to as the outside sense amplifier block group.

The data bus DBUS also has a p-type transistor QDPC1 (first precharging transistor) controlled by the control signal DPCn1 and precharging the first partial data bus DBUS1, and a p-type transistor QDPC2 (second precharging transistor) controlled by the control signal DPCn2 and precharging the second partial data bus DBUS2.

As shown in FIG. 3, each of the sense amplifier blocks SAB includes a sense amplifier SA, a sense latch SL and two data latches DL1, DL2. The sense amplifier SA is connected via the local bus LBUS to the sense latch SL, and data latches DL1, DL2. In addition, the sense amplifier SA is connected via a sense node SEN and an n-type transistor QSA controlled by the control signal SASW to the data bus DBUS. In addition, the local bus LBUS is connected to the high voltage Vddsa via a p-type transistor QLPC controlled by the control signal LPCn. That is, as this transistor QLPC is turned on, the local bus LBUS can be charged.

In addition, there are two data latches in each of the sense amplifier blocks SAB. This is for allowing storage of 2-bit data in 1 memory cell MC (2 bits/cell). Consequently, if a 1-bit data is to be stored in 1 memory cell MC, the data latch DL2 may be omitted. In addition, when a 3-or-more-bit data is to be stored in 1 memory cell MC, one may simply arrange more data latches in addition to the data latches DL1, DL2.

The external data latches XDL are data latches adopted as the so-called data cache. They have the function for temporarily holding the data fed from the input/output buffer 5. The data latches XDL of this type are formed at a position farther from the memory cell array 1 than the sense amplifier blocks SAB. That is, the sense amplifier blocks SAB are formed between the memory cell array 1 and the data latches XDL.

In the following, the operation of the column decoder 2 in this embodiment will be explained. Here, among various processing carried out in the column decoder 2 in company with data read or data write operation, the operation that the data are held in the data latch XDL<j> on the basis of the data held in the sense amplifier block SAB<j> (j=0 to 15) will be explained below. In the following, this operation will be referred to as "arithmetic and logic operation process".

Figure 4:
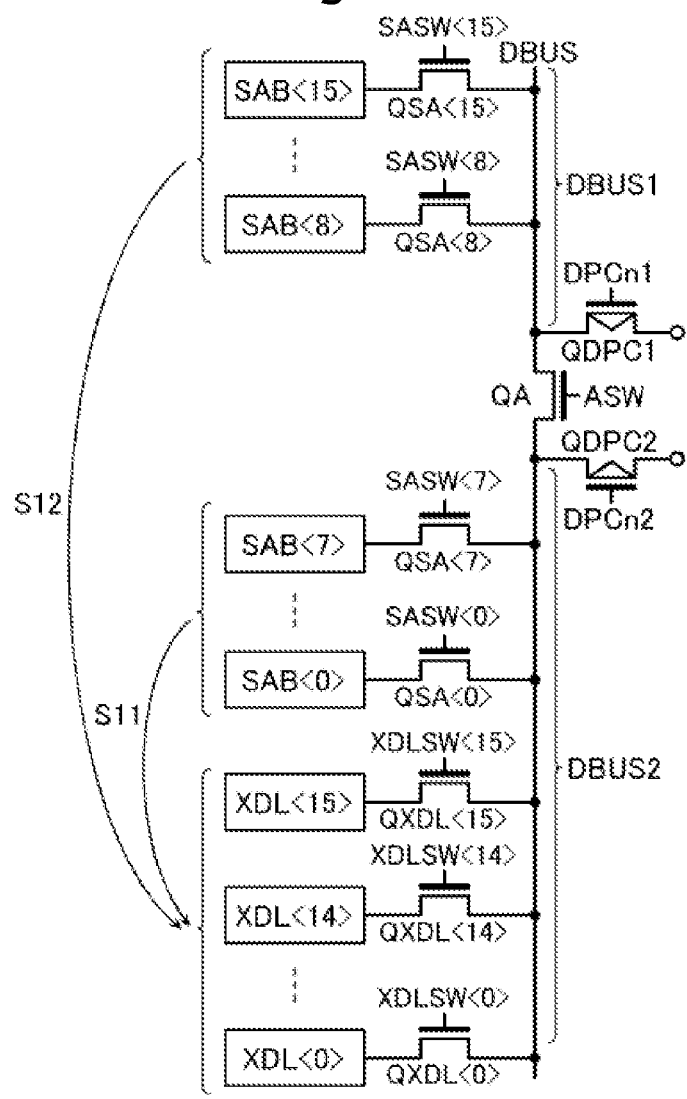
FIG. 4 is a diagram schematically illustrating the arithmetic and logic operation process in the column decoder of the nonvolatile semiconductor memory device according to the first embodiment.

FIG. 4 is a schematic diagram illustrating the arithmetic and logic operation process in the column decoder 2 in this embodiment. As shown in FIG. 4, the sense amplifier block SAB<j> is electrically connected to the data bus DBUS by the n-type transistor QSA<j> controlled by the control signal SASW<j>, and the data latch XDL<j> is electrically connected to the data bus DBUS by the n-type transistor QXDL<j> controlled by the control signal XDLSW<j>.

As shown in FIG. 4, the arithmetic and logic operation process in this embodiment is executed first by the inner side arithmetic and logic operation process (S11 in FIG. 4), and then by the outside arithmetic and logic operation process (S12 in FIG. 4), followed by repeatedly alternating the execution the inner side arithmetic and logic operation process with the execution of the outside arithmetic and logic operation process. Here, the inner side arithmetic and logic operation process refers to the arithmetic and logic operation process carried out between the sense amplifier block SAB<j1> (j1=0 to 7) of the inner side sense amplifier block group and the data latch XDL<j1>. The outside arithmetic and logic operation process refers to the arithmetic and logic operation process carried out between the sense amplifier block SAB<j2> (j2=8 to 15) of the outside sense amplifier block group and the data latches XDL<8> to <15>.

Figure 5:
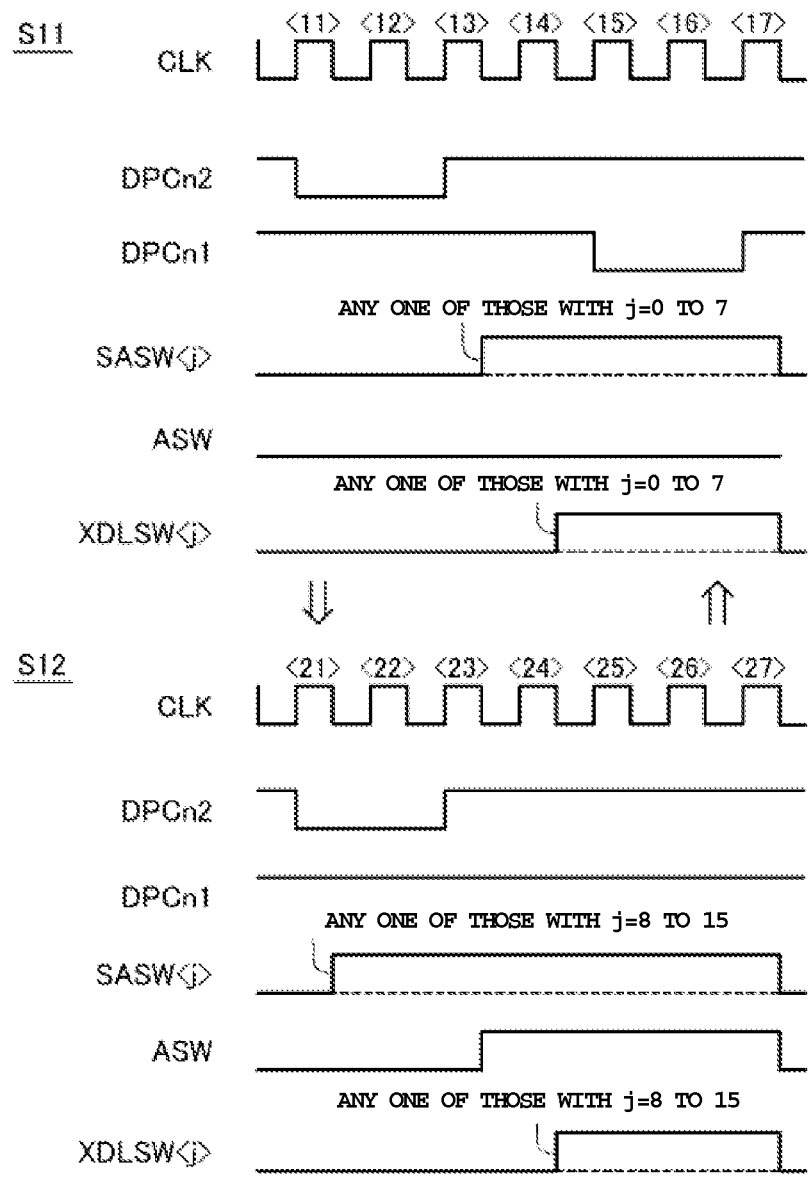
FIG. 5 is a diagram illustrating a waveform of the control signal in the arithmetic and logic operation process in the column decoder of the nonvolatile semiconductor memory device according to the first embodiment.

In the following, the arithmetic and logic operation process in this embodiment will be explained in more detail with reference to the waveforms of the control signal during the arithmetic and logic operation process in the column decoder 2 shown in FIG. 5. The various control signals shown in FIG. 5 may be sent from the controller 4 as the control module (control part), or they may be generated inside the column decoder 2.

In the inner side arithmetic and logic operation process S11, before starting the process, the control signals are set as follows: DPCn2="H" (the inner side precharge signal), DPCn1="H" (the outside precharge signal), SASW<j>="L", ASW="L", and XDLSW<j>="L" (the data latch signal). As a result, the precharge is stopped for the first partial data bus DBUS1 and the second partial data bus DBUS2. The sense amplifier block SAB<j> and the data latch XDL<j> are electrically cut off from the data bus DBUS. In addition, the second partial data bus DBUS2 is electrically cut off from the first partial data bus DBUS1.

In this state, first of all, as the clock CLK<11> rises, the control signal DPCn2 falls to L (activated). As a result, precharge starts with respect to the second partial data bus DBUS2.

Then, as the clock CLK<13> rises, the control signal DPCn2 rises to H (deactivated). As a result, the precharge for the second partial data bus DBUS2 is ended. Here, the precharge for the second partial data bus DBUS2 needed for the arithmetic and logic operation process ends in the period from rise of the clock CLK<11> to the rise of the clock CLK<13>.

Then, as the clock CLK<13> falls, the control signal SASW<j1'> (j1' is any one of j1) rises to H (activated). As a result, the transistor QSA<j1'> is turned on, and the potential of the second partial data bus DBUS2 starts changing on the basis of the data held in the sense amplifier block SAB<j1'>.

Then, as the clock CLK<14> falls, the control signal XDLSW<j1'> rises to H' (activated). As a result, the transistor QXDL<j1'> is turned on, and the data corresponding to the potential of the second partial data bus DBUS2 is stored in the data latch XDL<j1'>.

Then, as the clock CLK<15> rises, the control signal DPCn1 rises to L (activated). As a result, the precharge to the first partial data bus DBUS1 starts.

Then, as clock CLK<17> rises, the control signal DPCn1 rises to H (deactivated). As a result, the precharge for the first partial data bus DBUS1 ends. Here, during the period from the rise of the clock CLK<15> to the rise of the clock CLK<17>, the precharge for the first partial data bus DBUS1 needed for the arithmetic and logic operation process ends.

Finally, as the clock CLK<17> falls, the control signals SASW<j1'> and XDLSW<j1'> rise to L' (deactivated). As a result, the transistors QSA<j1'> and QXDL<j1'> are turned off, and the sense amplifier block SAB<j1'> and the data latch XDL<j1'> are electrically cut off from the data bus DBUS. In this state, the column decoder 2 is prepared for the next outer side arithmetic and logic operation process S12.

The outside arithmetic and logic operation process S12 starts from the state when the inner side arithmetic and logic operation process S11 ends. That is, the control signals are set as follows: DPCn2='H', DPCn1='H', SASW <j>='L', ASW=BSW='L', XDLSW <j>='L'. As a result, the precharge for the first partial data bus DBUS1 and the second partial data bus DBUS2 are stopped. The sense amplifier block SAB<j> and the data latch XDL<j> are electrically cut off from the data bus DBUS. Also, the second partial data bus DBUS2 is electrically cut off from the first partial data bus DBUS1.

In this state, first of all, as the clock CLK<21> rises, the control signal DPCn2 falls to L (activated). As a result, the precharge for the second partial data bus DBUS2 starts.

Then, as the clock CLK<21> falls, the control signal SASW<j2'> (j2' is any one of j2) rises to H (activated). As a result, the transistor QSA<j2'> is turned on, and the potential of the first partial data bus DBUS1 starts changing on the basis of the data held in the sense amplifier block SAB<j2'>.

Then, as the clock CLK<23> rises, the control signal DPCn2 rises to H (deactivated). As a result, the precharge for the second partial data bus DBUS2 ends. Here, during the period from the rise of the clock CLK<21> to the rise of the clock CLK<23>, the precharge for the second partial data bus DBUS2 needed for the arithmetic and logic operation process ends.

Then, as the clock CLK<23> falls, the control signal ASW rises to H (activated). As a result, the transistor QA is turned on, and the second partial data bus DBUS2 is electrically connected to the first partial data bus DBUS1. As a result, the second partial data bus DBUS2 also has its potential starts changing on the basis of the data of the sense amplifier block SAB<j2'>.

Then, as the clock CLK<24> falls, the control signal XDLSW<j2'> rises to H (activated). As a result, the transistor QXDL<j2'> is turned on, and the data corresponding to the data bus DBUS is stored in the data latch XDL<j2'>.

Finally, as the clock CLK<27> falls, the control signal SASW<j2'> and XDLSW<j2'> fall to L (deactivated). As a result, the transistor QSA<j2'> and the transistor QXDL<j2'> are turned off, and the sense amplifier block SAB<j2'> and the data latch XDL<j2'> are electrically cut off from the data bus DBUS. Also, the control signal ASW also falls to L (deactivated). As a result, the transistor QA is turned off, and the second partial data bus DBUS2 is electrically cut off from the first partial data bus DBUS1. In this state, the column decoder 2 is prepared for the next inner side arithmetic and logic operation process S11.

The operations, such as the inner side arithmetic and logic operation process S11 between the sense amplifier blocks SAB <0> and the data latch XDL<0>, the outside arithmetic and logic operation process S12 between the sense amplifier blocks SAB <1> and the data latch XDL<1>, the inner side arithmetic and logic operation process S11 between the sense amplifier blocks SAB <2> and the data latch XDL<2>, . . . the outside arithmetic and logic operation process S12 between the sense amplifier blocks SAB <14> and the data latch XDL<14>, the inner side arithmetic and logic operation process S11 between the sense amplifier blocks SAB <7> and the data latch XDL<7>, and the outside arithmetic and logic operation process S12 between the sense amplifier blocks SAB <15> and the data latch XDL<15> are alternately carried out repeatedly in this order. As a result, it is possible to execute all of the arithmetic and logic operation processes in the column.

In the following, the effects of the present embodiments will be explained with reference to a comparative example.

FIG. 9 is a diagram illustrating the constitution of the column decoder of the nonvolatile semiconductor memory device according to the comparative example of this embodiment. The same keys as those in the above in FIG. 2 are adopted here for the same configuration.

The column decoder of this comparative example differs from the constitution of the column decoder 2 in this embodiment shown in FIG. 2 in that no transistor for electrically dividing the data bus DBUS is arranged in the data bus DBUS.

In this case, each time when the arithmetic and logic operation process is carried out between the sense amplifier block SAB<j> and the data latch XDL<j> as one group, it is necessary to carry out charging/discharging for the entirety of the data bus DBUS. In this case, it requires a long time for the charging/discharging of the data bus DBUS, and the peak current is also high.

At this point, according to this embodiment, the first partial data bus DBUS1 and the second partial data bus DBUS2 can be electrically cut off (disconnected) from each other.

In this case, in the inner side arithmetic and logic operation process S11, it is only required that charging/discharging be carried out for the second partial data bus DBUS2 alone. Consequently, compared with the comparative example, the time needed for carrying out charging/discharging of the data bus DBUS can be shortened. Also, in the inner side arithmetic and logic operation process S11, during the period of fetching of the data of the second partial data bus DBUS2 by the data latch XDL<j1'> (the period from fall of the clock CLK<14> to the fall of the clock CLK<17>), it is possible to precharge the first partial data bus DBUS1. As a result, in the outside arithmetic and logic operation process S12, it is only required that the second partial data bus DBUS2 alone be precharged. Consequently, compared with the comparative example, the time needed for precharging the data bus DBUS can be shortened.

In addition, according to the present embodiment, precharge of the first partial data bus DBUS1 and that of the second partial data bus DBUS2 can be carried out separately from each other, so that it is possible to decrease the peak current as compared with the comparative example.

That is, compared with the comparative example, by simply adding one transistor to the data bus, it is possible to shorten the time needed for the arithmetic and logic operation process in the column decoder and to decrease the peak current. ps (Second Embodiment)

According to the first embodiment, by making electrical connection/cutoff between the inner side portion and the outside portion of the sense amplifier portion alone in the data bus, it is possible to reduce the time needed for the arithmetic and logic operation process in the column decoder and to decrease the peak current. On the other hand, according to the second embodiment, in addition, an additional transistor is also arranged for the data latch portion to so the data bus can be further electrically connected/cut-off.

Figure 6:
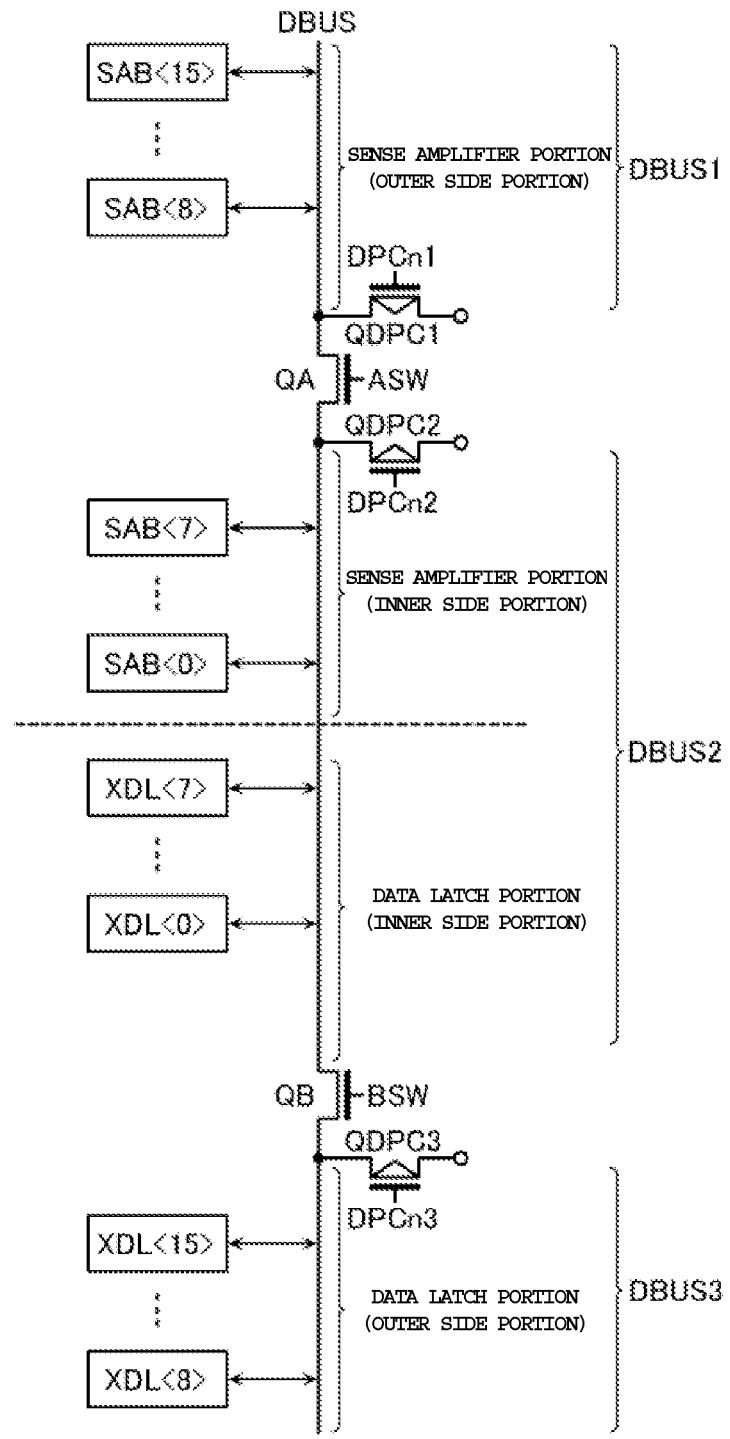
FIG. 6 is a diagram illustrating a column decoder of the nonvolatile semiconductor memory device according to a second embodiment.

FIG. 6 is a diagram illustrating the constitution of the column decoder 2 in this second embodiment In the column decoder 2 of this second embodiment, the data bus DBUS has the data latch portion divided in to an inner side portion adjacent to the sense amplifier portion and having the data latches XDL<0> to <7> connected to it, and an outer side portion that is farther from the sense amplifier portion from the inner side portion and has the data latches XDL<8> to <15> connected to it. The inner side portion and outer side portion of these data latch portions are connected with each other via an n-type transistor QB (the second switch) controlled by the control signal BSW. In other words, the data bus DBUS is formed from 3 portions that can be electrically connected/disconnected from each other by transistors QA (first switch) and QB.

In the following, the portion nearer the side of the memory cell array 1 than the transistor QA is called the first partial data bus DBUS1, the portion between the transistors QA and QB is called the second partial data bus DBUS2, and the portion nearer the side of the input/output buffer 5 than the transistor QB is called the third partial data bus DBUS3.

Also, the collection of the sense amplifiers SAB<0> to <7> connected to the second partial data bus DBUS2 is called the inner side sense amplifier block group, the sense amplifier blocks SAB<8> to <15> connected to the first partial data bus DBUS1 is called the outside sense amplifier block group, the collection of the data latches XDL<0> to <7> connected to the second partial data bus DBUS2 is called the inner side data latch group, and the collection of the data latches XDL<8> to <15> connected to the third partial data bus DBUS3 is called the outside data latch group.

The data bus DBUS also has a p-type transistor QDPC1 that is controlled by the control signal DPCn1 to precharge the first partial data bus DBUS1, a p-type transistor QDPC2 controlled by the control signal DPCn2 to precharge the second partial data bus DBUS2, and a p-type transistor QDPC3 controlled by the control signal DPCn3 to precharge the third partial data bus DBUS3.

In the following, the operation of the arithmetic and logic operation process of the column decoder 2 in this second embodiment will be explained.

Figure 7:
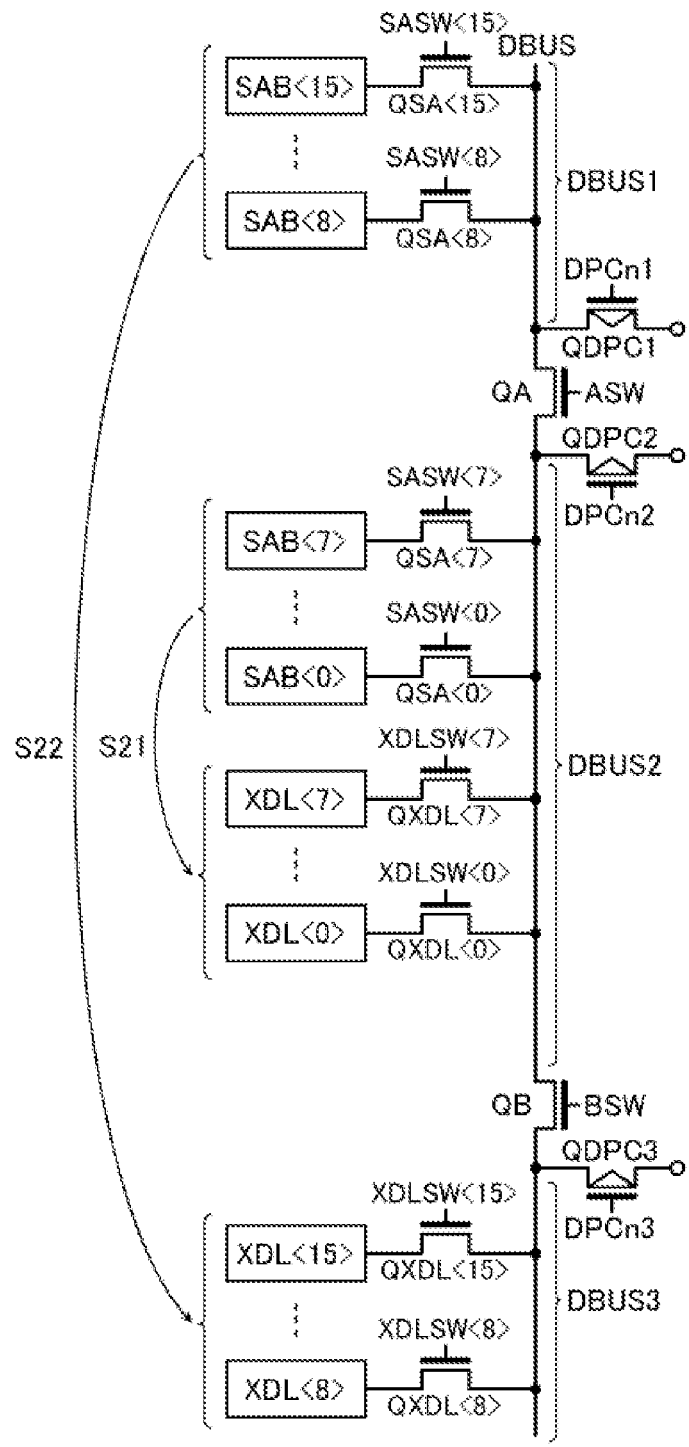
FIG. 7 is a diagram schematically illustrating the arithmetic and logic operation process in the column decoder of the nonvolatile semiconductor memory device according to the second embodiment.

FIG. 7 is a schematic diagram illustrating the arithmetic and logic operation process of the column decoder 2 in this embodiment. As shown in FIG. 7, the sense amplifier block SAB<j> is electrically connected to the data bus DBUS by the n-type transistor QSA<j> controlled by the control signal SASW<j>, and the data latch XLD<j> is electrically connected to the data bus DBUS by the n-type transistor QXDL<j> controlled by the control signal XDLSW<j>.

As shown in FIG. 7, in the arithmetic and logic operation process of this embodiment, first of all, the inner side arithmetic and logic operation process (S21 shown in FIG. 7) is executed. Then, the outside arithmetic and logic operation process (S22 as shown in FIG. 7) is executed. After that, the inner side arithmetic and logic operation process and the outside arithmetic and logic operation process are executed repeated in an alternately manner. Here, the inner side arithmetic and logic operation process refers to the arithmetic and logic operation process between the sense amplifier blocks SA<j1> (j1=0 to 7) of the inner side sense amplifier block group and the data latches XDL<j1> of the inner side data latch group. The outside arithmetic and logic operation process refers to the arithmetic and logic operation process between the sense amplifier blocks SA<j2> (j2=8 to 15) of the outside sense amplifier block groups and the data latches XDL<j2> of the outside data latch group.

In the following, the arithmetic and logic operation process in this second embodiment will be explained in more detail with reference to the waveforms of the control signals in the arithmetic and logic operation process in the column decoder 2 shown in FIG. 8. The various control signals shown in FIG. 8 may be either sent from the controller 4 as a control part or generated inside the column decoder 2.

In the inner side arithmetic and logic operation process S21, first of all, the control signals are set as follows: DPCn3="H" (one of the outside precharge signals), DPCn2="H" (inner side precharge signal), DPCn1="H" (one of the outside precharge signals), SASW<j>="L", ASW=BSW="L", and XDLSW<j>="L" (data latch signal). As a result, precharge is stopped for the first partial data bus DBUS1, the second partial data bus DBUS2 and the third partial data bus DBUS3. The sense amplifier block SAB<j> and the data latch XDL<j> are electrically cut off from the data bus DBUS. In addition, the second partial data bus DBUS2 is electrically cut off from the first partial data bus DBUS1. Similarly, the third partial data bus DBUS3 is also electrically cut off from the second partial data bus DBUS2.

In this state, first of all, as the clock CLK<11> rises, the control signal DPCn2 falls to L (activated). As a result, precharge starts with respect to the second partial data bus DBUS2.

Then, as the clock CLK<13> rises, the control signal DPCn2 rises to H (deactivated). As a result, the precharge for the second partial data bus DBUS2 is ended. Here, the precharge for the second partial data bus DBUS2 needed for the arithmetic and logic operation process ends in the period from rise of the clock CLK<11> to the rise of the clock CLK<13>.

Then, as the clock CLK<13> falls, the control signal block SASW<j1'> (j1' is anyone of j1) rises to H (activated). As a result, the transistor QSA<j1'> is turned on, and the potential of the second partial data bus DBUS2 starts changing on the basis of the data held in the sense amplifier block SAB<j1'>.

Then, as the clock CLK<14> falls, the control signal XDLSW<j1'> rises to H (activated). As a result, the transistor QXDL<j1'> is turned on, and the data corresponding to the potential of the second partial data bus DBUS2 is stored in the data latch XDL<j1'>.

Then, as the clock CLK<15> rises, the control signals DPCn1 and DPCn3 falls to L (activated). As a result, the precharge to the first partial data bus DBUS1 and the third partial data bus DBUS3 starts.

Then, as clock CLK<17> rises, the control signals DPCn1 and DPCn3 rise to H (deactivated). As a result, the precharge for the first partial data bus DBUS1 and the third partial data bus DBUS3 ends. Here, during the period from the rise of the clock CLK<15> to the rise of the clock CLK<17>, the precharge for the first partial data bus DBUS1 and the third partial data bus DBUS3 needed for the arithmetic and logic operation process ends.

Finally, as the clock CLK<17> falls, the control signals SASW<j1'> and XDLSW<j1'> rise to L (deactivated). As a result, the transistors QSA<j1'> and QXDL<j1'> are turned off, and the sense amplifier block SAB<j1'> and the data latch XDL<j1'> are electrically cut off from the data bus DBUS. In this state, the column decoder 2 is prepared for the next outer side arithmetic and logic operation process S22.

The outside arithmetic and logic operation process S22 starts from the state when the inner side arithmetic and logic operation process S21 ends. That is, the control signals are set as follows: DPCn3='H', DPCn2='H', DPCn1='H', SASW <j>='L', ASW=BSW='L', XDLSW <j>='L'. As a result, the precharge for the first partial data bus DBUS1, the second partial data bus DBUS2 and the third partial data bus DBUS3 is stopped. The sense amplifier block SAB<j> and the data latch XDL<j> are electrically cut off from the data bus DBUS. Also, the second partial data bus DBUS2 is electrically cut off from the first partial data bus DBUS1. Similarly, the third partial data bus DBUS3 is electrically cut off from the second partial data bus DBUS2.

In this state, first of all, as the clock CLK<21> rises, the control signal DPCn2 falls to L (activated). As a result, the precharge for the second partial data bus DBUS2 starts.

Then, as the clock CLK<21> falls, the control signal SASW<j2'> (j2' is any one of j2) rises to H (activated). As a result, the transistor QSA<j2'> is turned on, and the potential of the first partial data bus DBUS1 starts changing on the basis of the data held in the sense amplifier block SAB<j2'>.

Then, as the clock CLK<23> rises, the control signal DPCn2 rises to H (deactivated). As a result, the precharge for the second partial data bus DBUS2 ends. Here, during the period from the rise of the clock CLK<21> to the rise of the clock CLK<23>, the precharge for the second partial data bus DBUS2 needed for the arithmetic and logic operation process ends.

Subsequently, as the clock CLK<23> falls, the control signals ASW and BSW rises to H (activated). As a result, the transistors QA and QB are turned on, and the first partial data bus DBUS1, the second partial data bus DBUS2 and the third partial data bus DBUS3 are electrically connected to each other. As a result, for the first partial data bus DBUS1 and the third partial data bus DBUS3, too, the potential starts changing on the basis of the data of the sense amplifier block SAB<j2'>.

Then, as the clock CLK<24> falls, the control signal XDLSW<j2'> rises to H (activated). As a result, the transistor QXD1<j2'> is turned on, and the data corresponding to the data bus DBUS is stored in the data latch XDL<j2'>.

Finally, as the clock CLK<27> falls, the control signal SASW<j2'> and XDLSW<j2'> fall to L (deactivated). As a result, the transistor QSA<j2'> and the transistor QXDL<j2'> are turned off, and the sense amplifier block SAB<j2'> and the data latch XDL<j2'> are electrically cut off from the data bus DBUS. Also, the control signals ASW and BSW also fall to L (deactivated). As a result, the transistors QA and QB are turned off, and the first partial data bus DBUS1, the second partial data bus DBUS2, and the third partial data bus DBUS3 are electrically cut off, respectively. In this state, the column decoder 2 is prepared for the next inner side arithmetic and logic operation process S21.

The operations, such as the inner side arithmetic and logic operation process S21 between the sense amplifier blocks SAB <0> and the data latch XDL<0>, the outside arithmetic and logic operation process S22 between the sense amplifier blocks SAB <8> and the data latch XDL<8>, the inner side arithmetic and logic operation process S21 between the sense amplifier blocks SAB <1> and the data latch XDL<1>, and, etc. The outside arithmetic and logic operation process S22 between the sense amplifier blocks SAB <14> and the data latch XDL<14>, the inner side arithmetic and logic operation process S21 between the sense amplifier blocks SAB <7> and the data latch XDL<7>, and the outside arithmetic and logic operation process S22 between the sense amplifier blocks SAB <15> and the data latch XDL<15> are alternately carried out repeatedly in this order. As a result, it is possible to execute all of the arithmetic and logic operation processes in the column.

According to the present embodiment, in addition to the sense amplifier portion, the data latch portion can also be electrically cut off. Consequently, in the inner side arithmetic and logic operation process that ends only for the second partial data bus, it is possible to shorten the time needed for charging/discharging of the data bus than that in the inner side arithmetic and logic operation process of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a plurality of memory strings each including multiple memory cells;
   a plurality of word lines, each connected to a different memory cell in the plurality of memory strings;
   a plurality of bit lines, each connected to a different memory string; and
   a column decoder connected to the plurality of bit lines, wherein the column decoder includes a plurality of sense amplifiers, a plurality of data latches, and a data bus connected to and shared by the sense amplifiers and the data latches, the data bus having multiple portions including first and second portions connected through a first switch, the sense amplifiers being connected to the first portion and connected to the second portion via the first portion and the first switch, and the data latches being connected to the second portion and connected to the first portion via the second portion and the first switch.

2. The nonvolatile semiconductor memory device of claim 1, wherein the data bus further includes a third portion, and a second switch between the second and third portions.

3. The nonvolatile semiconductor memory device of claim 2, wherein:
   the first portion of the data bus connects a first portion of the plurality of sense amplifiers to the first switch,
   the second portion of the data bus connects a second portion of the plurality of sense amplifiers and a first portion of the plurality of data latches to the first switch and the second switch, and
   the third portion of the data bus connects a second portion of the plurality of data latches to the second switch.

4. The nonvolatile semiconductor memory device of claim 3, wherein the first portion of the plurality of sense amplifiers is located on an outer side portion of a memory cell array.

5. The nonvolatile semiconductor memory device of claim 1, wherein the plurality of sense amplifiers includes a different sense amplifier for each bit line.

6. The nonvolatile semiconductor memory device of claim 1, wherein there are two data latches for each sense amplifier.

7. The nonvolatile semiconductor memory device of claim 1, further comprising precharging transistors each connected to one of the portions of the data bus.

8. A column decoder connected to an array of memory strings each connected by a bit line to the column decoder, comprising:
   a plurality of sense amplifier blocks;
   a plurality of data latches; and
   a data bus divided into a first partial data bus and a second partial data bus by a first switch and connected to and shared by the sense amplifier blocks and the data latches such that data from the sense amplifier blocks are transferred to the data latches first through the first partial data bus, and then through the first switch and the second partial data bus, and data from the data latches are transferred to the sense amplifier blocks first through the second partial data bus, and then through the first switch and the first partial data bus.

9. The column decoder of claim 8, wherein the data bus is further divided into a third partial data bus.

10. The column decoder of claim 9, further comprising a second switch connected between the second partial data bus and the third partial data bus.

11. The column decoder of claim 8, wherein there are two data latches for each sense amplifier block.

12. The column decoder of claim 8, wherein the plurality of sense amplifier blocks is between the array of memory strings and the plurality of data latches.

13. The column decoder of claim 8, wherein each bit line is connected to a respective sense amplifier block.

14. A method of controlling a column decoder having a plurality of sense amplifier blocks, a plurality of data latches, and a data bus for transferring data between sense amplifier blocks and data latches, wherein the data bus is divided into a first partial data bus and a second partial data bus, the method comprising:
   electrically disconnecting the first and second partial data buses from each other;
   precharging the second partial data bus while the sense amplifier blocks and the data latches are electrically disconnected from the second partial data bus;
   electrically connecting a first selected sense amplifier block to the second partial data bus;
   electrically connecting a corresponding data latch to the second partial data bus to store a data value provided by the first selected sense amplifier block;

precharging the first partial data bus while the sense amplifier blocks and the data latches are electrically disconnected from the first partial data bus;

electrically connecting a second selected sense amplifier block to the first partial data bus; and electrically connecting a corresponding data latch to the first partial data bus to store a data value provided by the second selected sense amplifier block.

15. The method of claim 14, wherein a first portion of the plurality of sense amplifier blocks is connected to the second partial data bus, the plurality of data latches is also connected to the second partial data bus, and a second portion of the plurality of sense amplifier blocks is connected to the first partial data bus.

16. The method of claim 15, wherein the first portion of the plurality of sense amplifier blocks and the second portion of the plurality of sense amplifier blocks are processed in an alternating manner.

* * * * *